United States Patent [19]

Schepis et al.

[11] Patent Number: 5,504,434
[45] Date of Patent: Apr. 2, 1996

[54] INSTRUMENT FOR THE MEASUREMENT OF ELECTRICAL CHARACTERISTICS DURING MANUFACTURING PROCESSES

[75] Inventors: Dominic J. Schepis, Wappingers Falls; Krishna Seshan, Beacon, both of N.Y.

[73] Assignee: International Business Machines Corporation, Armonk, N.Y.

[21] Appl. No.: 453,590

[22] Filed: May 30, 1995

Related U.S. Application Data

[62] Division of Ser. No. 233,539, Apr. 26, 1994, which is a continuation of Ser. No. 996,766, Dec. 18, 1992, abandoned.

[51] Int. Cl.⁶ .............................. H01L 21/66; G01R 31/26
[52] U.S. Cl. ..................... 324/719; 324/520; 324/674; 324/707; 437/8
[58] Field of Search ........................... 324/765, 520, 324/619, 674, 719, 707; 437/8

[56] References Cited

U.S. PATENT DOCUMENTS

| | | |
|---|---|---|
| 3,155,898 | 11/1964 | Chope ............................ 324/639 |
| 3,155,900 | 11/1964 | Hanken . |
| 3,255,412 | 6/1966 | Liu . |
| 3,320,946 | 5/1967 | Dethloff et al. . |
| 3,327,207 | 6/1967 | Norwich . |
| 3,530,379 | 9/1970 | Demerliac . |
| 4,090,126 | 5/1978 | Poticha et al. . |
| 4,367,438 | 1/1983 | Medwin . |
| 4,408,282 | 10/1983 | Hof . |
| 4,458,196 | 7/1984 | Goyal et al. . |
| 4,473,795 | 9/1984 | Wood . |
| 4,481,464 | 11/1984 | Noguchi et al. . |
| 4,496,900 | 1/1985 | DiStefano et al. . |
| 4,570,116 | 2/1986 | Tedd et al. . |
| 4,580,233 | 4/1986 | Parker et al. . |
| 4,638,242 | 1/1987 | Matsuno . |
| 4,820,969 | 4/1989 | Yonekura et al. . |
| 4,868,506 | 9/1989 | DiStefano et al. . |
| 4,871,962 | 10/1989 | Cheung . |
| 4,902,631 | 2/1990 | Downey et al. . |
| 4,962,461 | 10/1990 | Meyer et al. . |
| 5,057,441 | 10/1991 | Gutt et al. . |
| 5,213,985 | 5/1993 | Sandroff ............................ 437/8 |

*Primary Examiner*—Kenneth A. Wieder
*Assistant Examiner*—Jose M. Solis
*Attorney, Agent, or Firm*—Whitham, Curtis, Whitham & McGinn; Alison D. Mortinger

[57] ABSTRACT

A measurement technique and instrument using rectangular pulse trains of differing repetition rates and synchronously operated lock-in amplifiers to reject electrical noise and capture changes in resistance and capacitance of an electrical element even during a short electrical pulse applied thereto or in the presence of high levels of electrical noise. Particular applications are for electrical programming of fuses and repair of conductors by material deposition.

26 Claims, 2 Drawing Sheets

INSTRUMENT FOR THE MEASUREMENT OF ELECTRICAL CHARACTERISTICS DURING MANUFACTURING PROCESSES

CROSS REFERENCE TO RELATED APPLICATION

This application is a division of application Ser. No. 08/233,539 filed Apr. 26, 1994 pending, which is a continuation of application Ser. No. 07/996,766 filed Dec. 18, 1992 now abandoned.

BACKGROUND OF THE INVENTION

1. Field of the Invention

The present invention generally relates to measurement of the electrical characteristics of circuit elements and, more particularly, to the measurement of change of electrical characteristics during manufacturing processes and other environments having high levels of electrical noise.

2. Description of the Prior Art

Virtually all techniques for the measurement of electrical characteristics of materials, particularly when formed into electrical devices such as resistors, capacitors, inductors, transformers, transistors and the like rely on measurement of a response voltage or current to a known input current or voltage applied to two terminals of the device. The voltage can be monitored directly across the terminals of the device using well-known devices such as so-called multi-meters, oscilloscopes or other devices. The current through the device is usually monitored by measuring voltage across a known calibration or test resistance placed in series with the device. Such a test resistance is often built into the measurement instrument and is commonly referred to as a shunt. This shunt typically has a low resistance of a small fraction of an ohm and provides consistency of measurements made with the instrument.

The current or voltage applied during the test may be invariant at one or each of a sequence of levels for the measurement of resistance. Such an invariant voltage or current is often collectively referred to as direct current or DC and is typically used in resistance measurements. Measurements of capacitance and inductance values however requires the application of time-varying voltages and currents, often in the form of a sine wave, and collectively referred to as alternating current or AC.

It should be noted that the very basic arrangement, described above, of a series circuit containing the element or device under test (DUT) and a test resistance theoretically relies of the fact that no additional currents or voltages are added to the circuit. That is, that no voltages or currents will be induced in the DUT other than those caused by the applied current and that all current passing through the test resistor or shunt will also pass through the DUT. However, all electrical circuits are subject to electrical noise generated by the environment. In some cases, shielding of the test leads or the instrument provide .sufficient immunity from such noise. In other cases, elaborate shielding may be required to obtain useful results depending on the accuracy desired.

In the fabrication of electrical components however, it is also often useful to monitor the fabrication process by monitoring changes in electrical characteristics of elements. These tests usually require relatively high accuracy and connection of test instruments to the device being manufactured is often difficult. Therefore, in the past, it has been the practice to provide test structure on the edge of a wafer or substrate and to measure changes in electrical characteristics of the test structure; merely inferring the electrical characteristics of the elements being manufactured. Further, due to the high levels of electrical noise present in many manufacturing processes, it was usually necessary to halt the process and remove the wafer or substrate from the process in order to make the measurement. Therefore the process was interrupted and throughput was diminished. Further, the accuracy of inferences from the measurement was compromised by the need to re-start the process.

At the very large scale of circuit integration in modern devices, it is no longer considered sufficient, in many cases, to infer device fabrication from test structures. Further, in two particular instances, at least, it has been found mandatory to not only directly measure the elements being formed but to do so during the fabrication process, itself. Specifically, in large scale integrated circuits, it is a common practice for the increase of manufacturing yield to provide redundant circuits on the integrated circuit chip or in a module, such as a so-called multi-layer module (MLM) which contains many layers of interconnection patterns for the interconnection of many chips. These redundant elements may be then tested and defective elements disconnected or shunted while functionally substituting ones of the redundant circuits. Disconnection is usually done by the use of fuses which can be electrically, mechanically or optically destroyed without damage, in theory, to the remainder of the integrated circuit. So-called antifuses which are initially of high impedance and are made into low impedance connections by destruction of a dielectric and/or reflow of conductive material are also known for making programmable connections in much the same manner as fusible links are destroyed.

Electrical destruction of fuses is generally preferred at the present time since better operational margins are provided when the fusible element is subjected to a brief pulse of a voltage on the order of 50% greater than the intended operating voltage. Since the fusible elements have a low volume, heating occurs differentially and higher temperatures are developed in the fusible elements than in the other electrical components of the integrated circuit even if those other electrical components cannot be isolated from the pulse. Nevertheless operating margins are not excessive and it is, in any case, necessary to determine that destruction of a fuse has been carried out.

Antifuses and more modern fuses, such as so-called capacitive fuses in which the capacitive change is large and somewhat independent of the resistive change (and which function by causing phase shift to disable a circuit) require monitoring during the programming process since, at the small size of these devices the impedance change may only be a few orders of magnitude during a standard programming pulse. This change of impedance may or may not be sufficient for programming within a particular circuit and further programming pulses may be required. Thus, the need for determining the adequacy of programming requires monitoring of each programmable element.

The large scale of integrated circuits and modules currently possible with current technology also makes testing and repair desirable during fabrication. Many devices currently require several hundred process steps and repairs, while time-consuming and difficult, often become economically preferable after only the first few steps of manufacture. The repair of wiring, particularly on integrated circuits is preferably done through deposition of further metal. In this case, charged species of the deposited material are generally present and may represent injection of current into the DUT which does not also pass through the test resistance. Further, strong, high frequency electrical fields are generally present during material deposition processes and present an unavoidable source of noise of a magnitude which completely masks the desired measurement, or so nearly so that accurate control of the manufacturing process cannot be reliably based thereon.

SUMMARY OF THE INVENTION

It is therefore an object of the present invention to provide a test system, methodology and instrument capable of capturing changes in electrical characteristics and properties of materials during brief, high voltage pulses.

It is another object of the present invention to provide a test system, methodology and instrument capable of accurately measuring the changes in electrical characteristics of an element in the presence of large levels of electrical noise.

It is a further object of the invention to provide a test signal discrimination methodology which allows rejections of all signals not resulting from applied voltages and currents.

In order to accomplish these and other objects of the invention, a test apparatus is provided including a first oscillator having a pulse output at a first predetermined frequency, a second oscillator having a pulse output at a second predetermined frequency, means for applying said outputs of the first and second oscillators to a device under test, and a bi-modal lock-in amplifier responsive to voltages appearing across a test resistance and operated at each of the first and second frequencies.

In accordance with another aspect of the invention, a manufacturing process is provided including the steps of applying pulses having an amplitude and a first frequency to a device being manufactured, applying pulses having the same or a related amplitude and a second frequency to the device being manufactured, sampling current through the device being manufactured at each of the first and second frequencies, and controlling the manufacturing process during in response to results of the sampling step.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
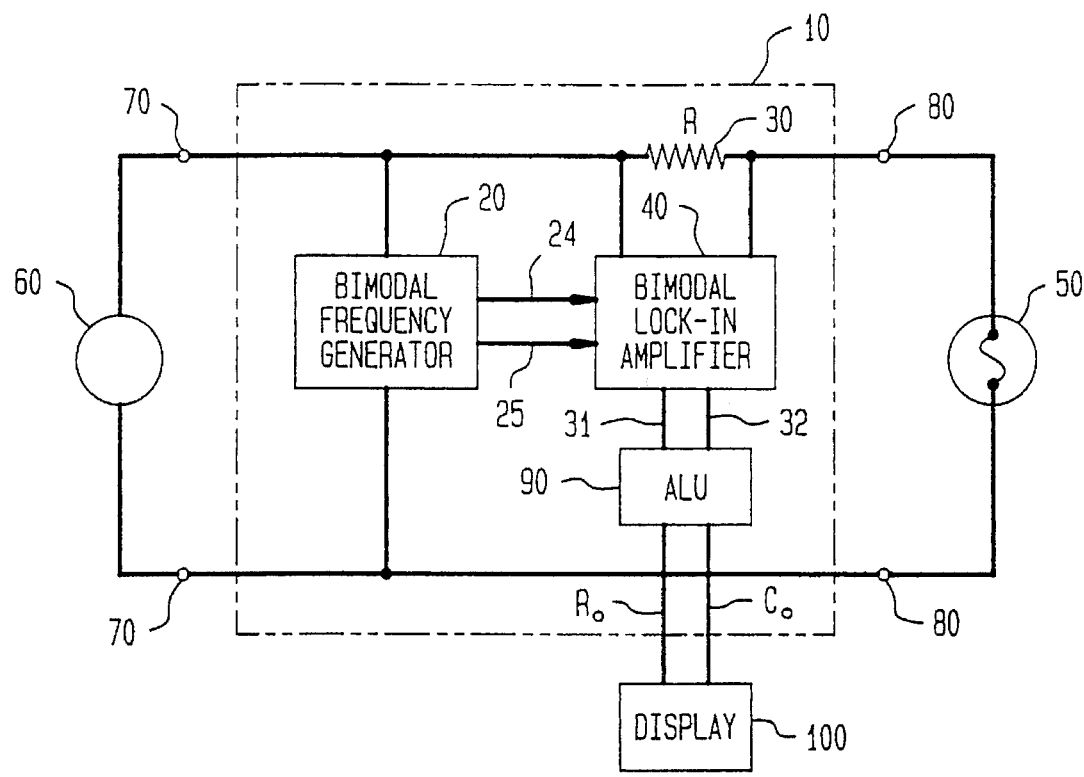
FIG. 1 is a generalized schematic block diagram of the invention.

Referring now to the drawings, and more particularly to FIG. 1, there is shown, in schematic form, a measurement arrangement 10 in accordance with the present invention. The overall organization provides two terminals 50 for the connection of a DUT and a further pair of terminals 70 to facilitate the application of electrical signals generated by signal generator 60 and associated with the process which is to be conducted while measurements are made.

It should be noted that both the destruction of fuses (or dielectrics in anti-fuses) and the deposition of material require such electrical signals to be applied across the element. Specifically, it is preferred to destroy fuses with a voltage pulse of about 50% greater voltage than the design operating voltage of the integrated circuit. The pulse duration is preferably a relatively small fraction of a millisecond. For deposition of material, a DC voltage is applied to terminal portions of an interrupted conductor to establish an electrostatic field which causes metal deposition from a plasma to occur preferentially between the terminal portions in order to "heal" the interrupted conductor. However, it is to be understood that the particular signal applied is not important to the practice of the invention although it should, nevertheless, be appreciated that either of these signals could be a source of noise or otherwise interfere with the desired measurement.

It should also be understood that the present invention is principally concerned with the simultaneous measurement of electrical impedance attributable to two electrical parameters, resistance and capacitance, particularly for observation of the response of capacitive fuses mentioned above. As is well-understood in the art, the impedance attributable to resistance and capacitance can be expressed in the form $Z=R+iC$ where the capacitive term will vary with frequency. Therefore, by measurement of response voltages at two known frequencies separated by about a decade in frequency, a system of two equations may be simultaneously solved for R and C. (This identical technique could be simultaneously used to measure R and the inductance, L.) If it were desired to include simultaneous measurement of inductance, L, with measurement of R and C, a third frequency would be required; an implementation of which will be readily apparent from the discussion of the preferred two-frequency (or "bimodal") embodiment, below.

The basic constitution of the preferred embodiment of the invention includes a bimodal frequency generator 20, a test resistance 30 and a bimodal lock-in amplifier 40 responsive to voltages developed across the test resistance 30. An arithmetic logic unit (ALU) 90 is preferably provided as part of the instrument to rapidly perform a solution to a system of equations to derive values of Ro and Co in response to measured voltage values. Neither the computational algorithm nor even the presence of computational logic in the ALU is particularly important to the practice of the invention and suitable mathematical processors are readily available. Alternatively, the ALU 90 may simply provide analog to digital conversion and the solution to the system of equations provided by an external digital computer, preferably including a mathematics co-processor.

Figure 2:
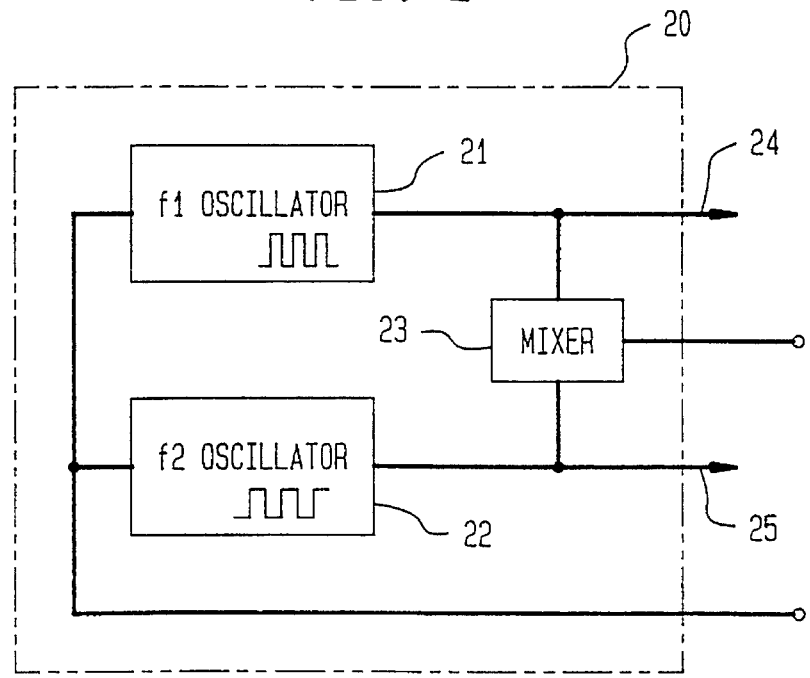
FIG. 2 is a schematic block diagram of the bimodal frequency generator of FIG. 1.

As shown in FIG. 2, the bimodal frequency generator 20 is constituted by two square wave oscillators 21 and 22. The only constraint upon these oscillators is that they must be capable of operation with a periodicity which is small (e.g. less than 10%) in comparison with the width of a pulse used for destroying fuses or otherwise involved in the process during which measurement is to be made and that the output voltage level should be well-regulated and matched to each other. The frequencies f1 and f2 at which the oscillators preferably operate are preferably not widely separated (e.g. several octaves and preferably somewhat more than a decade) and, therefore, regulation of output signal amplitude is not difficult. The respective oscillator outputs are simply mixed by mixer 23 to provide a composite signal to be applied to the test resistance and the DUT. It is also convenient but not necessary to provide connections 24 and 25 of the respective frequencies f1, f2 to the bimodal lock-in amplifier 30.

Figure 3:
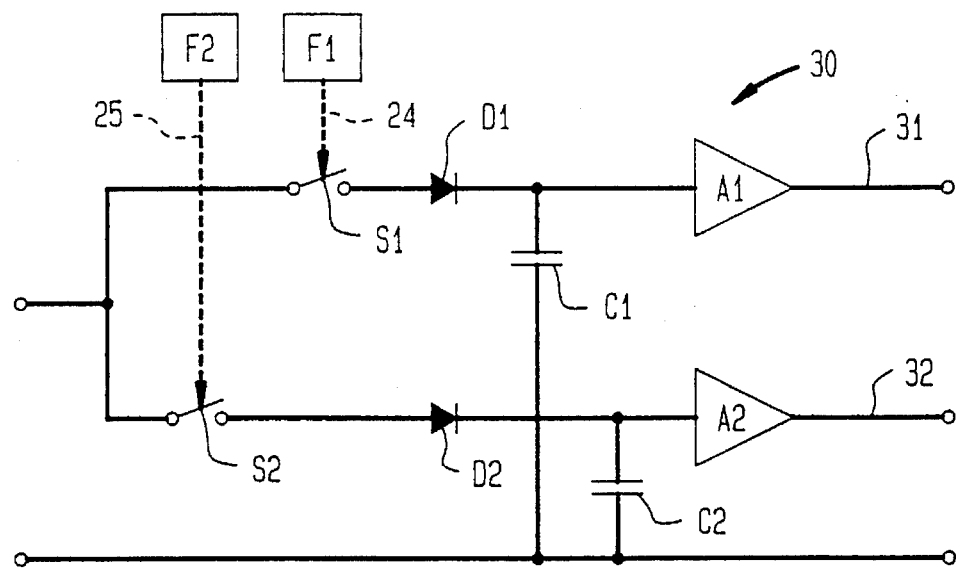
FIG. 3 is a schematic block diagram of the bimodal lock in amplifier of FIG. 1.

Referring now to FIG. 3, a schematic diagram of the bimodal lock-in amplifier is shown. Single channel lock-in amplifiers are known and commercially available. Essentially, a lock-in amplifier seeks to sample the amplitude of each of a plurality of equal amplitude pulses. By sampling in synchronism with the pulses, an extremely high degree of noise rejection (e.g. filtering at extremely high quality factor or Q) is obtained both from the blocking of noise signals at periods other than sampling times and averaging the noise which is present in the samples. Accordingly, each of the single channel lock-in amplifiers is depicted as an amplifier with an input circuit containing a switch (S1, S2) a detector diode (D1, D2) and a small sample storage capacitor (C1, C2). The time constant of the amplifier response should be sufficient to integrate at least two pulses at the lower of frequencies f1 and f2 but substantially shorter than the pulse duration of a process signal applied to terminals 70. The switches of the respective channels are operated synchronously with the pulses produced by oscillators 21, 22 of FIG. 2 and thus reject signals at all other frequencies. Therefore the bimodal lock-in amplifier will output two substantially DC signals, one (31) being the reactance voltage attributable to the amplitude of pulses at frequency f1 and the other (32) being the reactance voltage attributable to the amplitude of pulse at frequency F2.

It should be noted that for measurement of R, L and C, three frequencies are required, as noted above. A three-frequency (e.g. "trimodal") frequency generator would simple include a further oscillator such as 21 or 22, the output of which would also be mixed with that of oscillators 21 and 22 by mixer 23. To form a corresponding trimodal lock-in amplifier, it is only necessary to add a further single channel lock-in amplifier in the same manner as illustrated for the bimodal lock-in amplifier of FIG. 3. This would provide output values at three frequencies from which a system of three equations which can be solved by conventional techniques for R, L and C.

Figure 4:
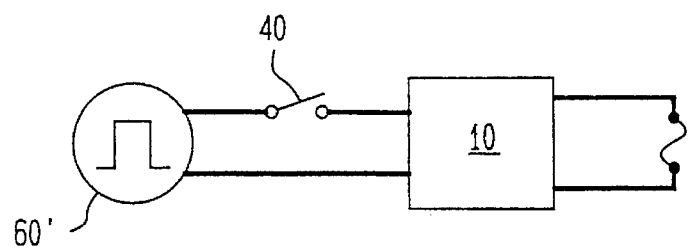
FIG. 4 illustrates application of the invention to destruction of fusible links during integrated circuit manufacture.

Referring now to FIG. 4, the use of the invention to measure changes in electrical characteristics of a fuse during destruction is shown. Once the bimodal lock-in amplifier is tracking the pulses from the oscillators, a fuse destruction pulse generated by generator 60' can be applied, for example, by closure of switch 40. Since frequencies f1 and f2 are chosen to be sufficiently high as to provide a minimum of 5–10 pulses during a fuse destroying pulse, the change of electrical characteristics during the pulse can clearly be captured. Reactance voltages due to frequencies in the pulse are rejected. Accordingly, while operating margins are still sufficiently small, measurement of change of resistance and capacitance of the fusible element with each of a plurality of pulses or even during a pulse is possible and the fuse destroying pulse can be optimized in order to minimize electrical and thermal stress-in the remainder of the integrated circuit. This technique is equally applicable to the programming of antifuses.

Figure 5:
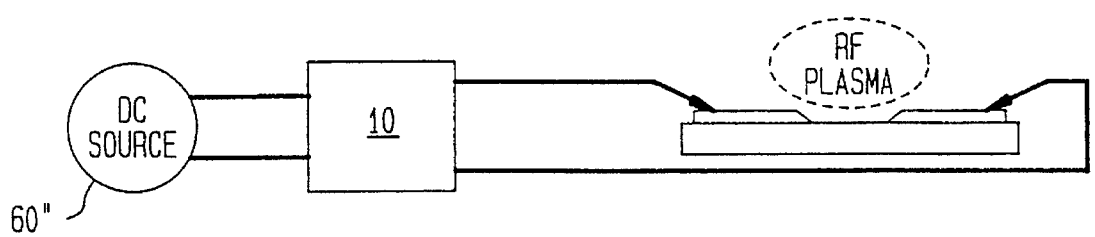
FIG. 5 illustrates application of the invention to the repair of conductors be metal deposition.

Similarly, the arrangement for measuring electrical characteristics during material deposition is shown in FIG. 5, including DC voltage source 60". In this case, the arrangement in accordance with the invention also rejects voltages induced by the currents represented by the charged species in the deposited material as well as currents induced by the RF plasma (hence, is also applicable to monitoring of ion implantation and dopant deposition processes). Thus, the deposition (or doping) process can be accurately monitored and end-point determinations made on the basis of actual electrical characteristics of the structure or electrical element created by the process.

In view of the foregoing, it is seen that the invention provides an electrical measurement apparatus and methodology which provides accurate measurement and monitoring under adverse conditions and during manufacturing processes. This methodology and apparatus rejects substantially all electrical noise and other signals not resulting from the application of known measurement voltages applied to the DUT.

While the invention has been described in terms of a single preferred embodiment, those skilled in the art will recognize that the invention can be practiced with modification within the spirit and scope of the appended claims. For instance, a modulation arrangement could be used in place of mixer 23 to apply the oscillator outputs to the DUT and a synchronized demodulator used in the bimodal or trimodal lock-in amplifier. Likewise, the oscillator output need not be synchronized directly with the oscillator outputs but various detectors such as phase-locked loops could be used to obtain synchronization. It is also possible to usefully practice the invention using empirical data rather than computing values of R and C (and possibly L). In this case, either amplitude or phase shift or a combination of the two between the measured signals at the different frequencies could be directly compared with a threshold to determine desired control of a process.

Having thus described my invention, what I claim as new and desire to secure by Letters Patent is as follows:

1. A process for manufacturing substrate-based electrical components that includes the application of energy with interfering noise content and an impedance measurement method, said impedance measurement method including the steps of applying a signal to said electrical components containing first, second and third frequency components with frequencies f1, f2 and f3, said frequencies being independently chosen for detection in the presence of said energy with interfering noise content;

measuring the response of the electrical components synchronously with said first, second and third frequency components only at frequencies f1, f2 and f3, and extracting impedance-related values from said applied signal and the measured response, said impedance-related values being used in adjusting the manufacturing process.

2. A manufacturing process as recited in claim 1, including the further step of applying a further signal to said electrical component being manufactured.

3. A manufacturing process as recited in claim 2, wherein said further signal is a pulse.

4. A manufacturing process as recited in claim 2, wherein said further signal is a DC voltage.

5. A manufacturing process as recited in claim 1, wherein said step of applying a signal to said electrical components includes the further step of mixing at least one of the frequency components with at least one other signal.

6. An apparatus for testing substrate-based electrical components being manufactured in a process that includes the application of energy with interfering noise content, the improvement comprising means for applying a signal to said electrical components containing first, second and third frequency components with frequencies f1, f2 and f3, said frequencies being independently chosen for detection in the presence of said energy with interfering noise content;

means for measuring the response of the electrical components synchronously with said first, second and third frequency components only at frequencies f1, f2 and f3, and means for extracting impedance-related values from said applied signal and the measured response, said impedance-related values being used in adjusting the manufacturing process.

7. A testing apparatus as recited in claim 6, wherein said signal applying means comprises a first oscillator having a pulse output at a first predetermined frequency, a second oscillator having a pulse output at a second predetermined frequency, and a third oscillator having a pulse output at a third predetermined frequency, and means for applying said outputs of said first, second and third oscillators to said electrical components.

8. A testing apparatus as recited in claim 7, wherein said measuring means comprises a tri-modal lock-in amplifier means responsive to voltages appearing across a test resistance and operated at each of said first, second and third frequencies.

9. A testing apparatus as recited in claim 7, wherein said means for applying said outputs of said oscillators includes a mixer circuit.

10. A testing apparatus as recited in claim 8, wherein said lock-in amplifier means is responsive to outputs of said oscillators for operation at said first, second and third frequencies.

11. A testing apparatus as recited in claim 7, further including means for applying a further signal to said electrical component.

12. A testing apparatus as recited in claim 11, wherein said further signal is provided by a pulse generator.

13. A testing apparatus as recited in claim 11, wherein said further signal is provided by a DC voltage generator.

14. A process for manufacturing substrate-based electrical components that includes the application of energy with interfering noise content and an impedance measurement method, said impedance measurement method including the steps of applying a signal to said electrical components containing first and second frequency components with frequencies f1 and f2, said frequencies being independently chosen for detection in the presence of said energy with interfering noise content;

measuring the response of the electrical components synchronously with said first and second frequency components only at frequencies f1 and f2, and extracting impedance-related values from said applied signal and the measured response, said impedance-related values being used in adjusting the manufacturing process.

15. A manufacturing process as recited in claim 14, including the further step of applying a further signal to said electrical component being manufactured.

16. A manufacturing process as recited in claim 15, wherein said further signal is a pulse.

17. A manufacturing process as recited in claim 15, wherein said further signal is a DC voltage.

18. A manufacturing process as recited in claim 14, wherein said step of applying a signal to said electrical components includes the further step of mixing at least one of the frequency components with at least one other signal.

19. An apparatus for testing substrate-based electrical components being manufactured in a process that includes the application of energy with interfering noise content, the improvement comprising means for applying a signal to said electrical components containing first and second frequency components with frequencies f1 and f2, said frequencies being independently chosen for detection in the presence of said energy with interfering noise content;

means for measuring the response of the electrical components synchronously with said first and second frequency components only at frequencies f1 and f2, and means for extracting impedance-related values from said applied signal and the measured response, said impedance-related values being used in adjusting the manufacturing process.

20. A testing apparatus as recited in claim 19, wherein said signal applying means comprises a first oscillator having a pulse output at a first predetermined frequency, a second oscillator having a pulse output at a second predetermined frequency, and means for applying said outputs of said first and second oscillators to said electrical components.

21. A testing apparatus as recited in claim 20, wherein said measuring means comprises a hi-modal lock-in amplifier means responsive to voltages appearing across a test resistance and operated at each of said first and second frequencies.

22. A testing apparatus as recited in claim 20, wherein said means for applying said outputs of said first and second oscillators includes a mixer circuit.

23. A testing apparatus as recited in claim 21, wherein said lock-in amplifier means is responsive to outputs of said first and second oscillators for operation at said first and second frequencies.

24. A testing apparatus as recited in claim 20, further including means for applying a further signal to said electrical component.

25. A testing apparatus as recited in claim 24, wherein said further signal is provided by a pulse generator.

26. A testing apparatus as recited in claim 24, wherein said further signal is provided by a DC voltage generator.

* * * * *

UNITED STATES PATENT AND TRADEMARK OFFICE
CERTIFICATE OF CORRECTION

PATENT NO. : 5,504,434
DATED : April 2, 1996
INVENTOR(S) : Dominic J. Schepis and Krishna Seshan It is certified that error appears in the above-indentified patent and that said Letters Patent is hereby corrected as shown below:

On the title page item [56],

Attorney, Agent, or Firm information, please remove the name "Alison D. Mortinger" and insert --Susan M. Murray--.

Signed and Sealed this

Fifteenth Day of October, 1996

*Attest:*

BRUCE LEHMAN

*Attesting Officer*     *Commissioner of Patents and Trademarks*